United States Patent [19]
Gehring

[11] 3,940,716
[45] Feb. 24, 1976

[54] DOUBLE-BALANCED MODULATING AND DEMODULATING APPARATUS

[76] Inventor: Donald H. Gehring, 3364 Ardley Court, Falls Church, Va. 22041

[22] Filed: Sept. 4, 1974

[21] Appl. No.: 503,157

[52] U.S. Cl. .............. 332/43 B; 329/50; 329/101; 329/146; 329/150; 329/163; 329/167; 332/31 T; 332/41; 332/44; 332/45
[51] Int. Cl.² .................... H03C 1/54; H03D 1/24
[58] Field of Search ............ 332/44.43 B, 45, 31 T, 332/41; 329/50, 101, 146, 150, 163, 167; 325/49, 50, 137, 138, 329, 330

[56] References Cited
UNITED STATES PATENTS

| | | | |
|---|---|---|---|
| 3,243,731 | 3/1966 | Erickson | 332/45 X |
| 3,252,094 | 5/1966 | Hughes et al. | 332/44 X |
| 3,514,720 | 5/1970 | Roucache et al. | 332/43 B |
| 3,810,047 | 5/1974 | Gehring | 332/44 X |

Primary Examiner—Siegfried H. Grimm
Attorney, Agent, or Firm—Lawrence E. Laubscher

[57] ABSTRACT

A double-balanced modulating and demodulating circuit is disclosed for producing from carrier and modulating input signals at least one double sideband suppressed carrier signal. A pair of dual-channel amplitude modulators are provided each of which is operable to produce a pair of full-wave unsuppressed-carrier amplitude-modulated output signals without filtering. The modulating signal is applied to each amplitude modulator in phase opposition, respectively, so as to produce envelopes of the output signals that are in phase opposition. The various outputs of the amplitude modulators are combined in summing circuits so as to produce without filtering two double sideband signals in phase opposition, respectively, and two reconstituted unmodulated carrier signals which are in phase opposition, respectively. By the use of feedback means, the device will operate as its own local oscillator.

23 Claims, 10 Drawing Figures

Fig. 5
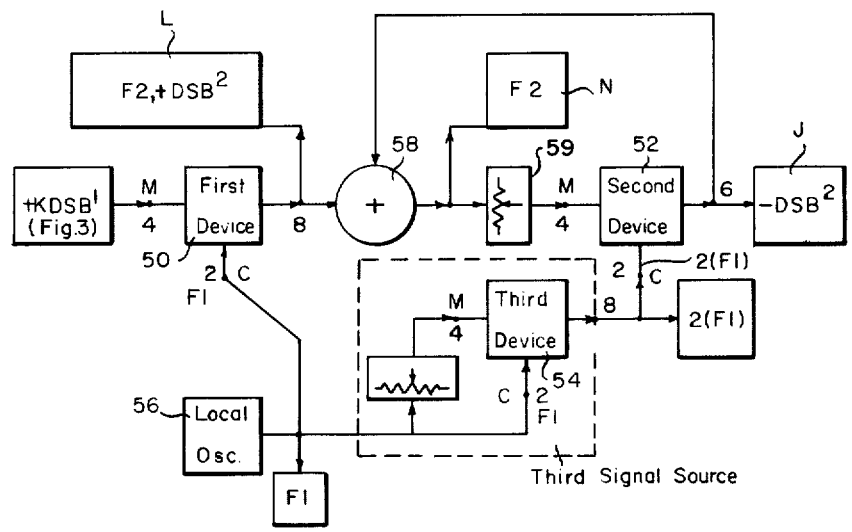
$+F2,+DSB^2$  L
$-DSB^2$  J
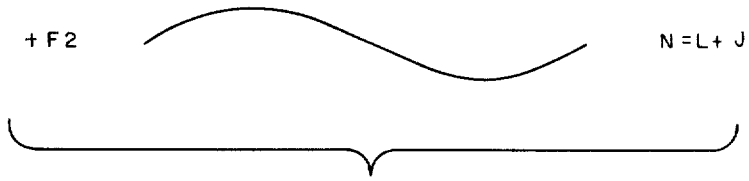
$+F2$  $N = L + J$
Fig. 6

DOUBLE-BALANCED MODULATING AND DEMODULATING APPARATUS

BRIEF STATEMENT OF THE INVENTION

This invention relates generally to a double-balanced modulating and demodulating apparatus including a pair of dual-channel amplitude-modulation modulators. While normally the output terminals of the amplitude modulators are connected to obtain at least one double sideband suppressed carrier signal, the terminals may also be connected by appropriate summing means to cancel the envelopes of the AM modulator output signals to obtain an unmodulated signal having the same frequency as the carrier signal, to obtain the demodulated signal during modulation, the modulation signal during demodulation, or a conventional amplitude modulated signal during both modulation and demodulation. By the use of a combination of a plurality of the modulator and demodulator circuits wherein all the undesirable signals are electrically cancelled, it is possible to obtain only the original modulating signal from a suppressed-carrier double-sideband-modulated input signal; an upper-sideband-suppressed-carrier modulated signal, a double-sideband-suppressed-carrier modulated signal, a lower-sideband-suppressed-carrier modulated signal, or an unsuppressed-carrier-amplitude-modulated signal. In these embodiments, the original modulating signal may be recovered regardless of the ratio F2/F1 since all undesirable signals are electrically cancelled rather than attenuated by frequency sensitive circuits. The invention has utility as a frequency multiplier, a frequency synthesizer and a self local oscillator. Included in the invention is a constant power supply drain feature.

DESCRIPTION OF THE PRIOR ART

Various types of balanced and double-balanced modulator and demodulator circuits are well known in the patented prior art, as evidenced by the patents to Rouache U.S. Pat. No. 3,514,720, Feldman U.S. Pat. No. 3,229,230 and Bell U.S. Pat. No. 3,205,457. In the known systems, filters and other frequency sensitive circuits are required to eliminate unwanted signals, such as device-generated harmonics of the carrier and modulating signals. For example, Feldman specifies that in the presence of a modulating signal, all odd harmonics of the carrier signal are present, including the fundamental frequency of the carrier. In the Bell apparatus, all odd harmonics of the carrier exist and interact with all odd harmonics of the modulating signal. All of the devices require filters which, regardless of adjustment, cause undesirable phase shifting and attenuation of desirable signals while filtering out the undesirable signals. None of the known devices includes means for ensuring a constant percent of conduction time per cycle of the carrier regardless of the instantaneous amplitude of the modulating signal, thereby to permit electrical cancellation of all device-generated harmonics, and none includes means for ensuring precise electrical cancellation of the carrier and modulating signals without matched active and passive circuit elements. None of the known devices permit recovery of a modulating signal whose frequency is even near that of the carrier.

The present invention was developed to avoid the above and other drawbacks of the known devices by providing an improved full-wave, double balanced modulator and demodulator circuit that is completely free of any inductor, transformer, tuned or other frequency sensitive circuit, provides constant power supply drain and which includes means which provide for complete suppression of the carrier in one output summation wherein only the upper and lower sidebands exist, and to provide for complete suppression of the sidebands in another output summation, wherein only the carrier exists.

SUMMARY OF THE INVENTION

In accordance with the present invention, an improved modulating and demodulating circuit is provided which includes a pair of dual-channel amplitude modulators each of which is operable to produce a pair of unsuppressed-carrier amplitude-modulated output signals, Carrier signal phase inverter means supply a carrier signal to each channel of the amplitude modulators to cause the channels of each amplitude modulator to operate alternately on each half cycle of the carrier, respectively, thereby enabling full-wave operation. Modulating signal phase inverter means supply a modulating signal in opposite phases to the amplitude modulating circuits, respectively, thereby causing the envelopes of the outputs of each amplitude modulating circuit to be in phase opposition, respectively. The outputs of the channels of each amplitude modulator are combined to produce one amplitude modulated output signal whose unsuppressed carrier is in-phase with the carrier signal input, another amplitude modulated output signal whose unsuppressed carrier is 180° out-of-phase with the carrier signal input; the modulating signal and all device generated harmonics being electrically cancelled from said amplitude modulated output signals. The outputs of the amplitude modulators are electrically combined to produce any number of desired signals. Preferably the carrier-in-phase output signal of one amplitude modulator is combined with the carrier-out-of-phase output signal of the other amplitude modulator to obtain a first double sideband output signal from which the carrier signal has been cancelled. A plurality of the modulating and demodulating circuits may be combined with summing means to obtain solely the original modulating signal from: a suppressed-carrier double-sideband-modulated signal; an upper-sideband-suppressed-carrier modulated signal, a lower-sideband-suppressed-carrier modulated signal, an amplitude-modulated-unsuppressed-carrier signal; an unsuppressed-carrier-amplitude modulated signal. In these plurality embodiments, recovery of the original modulating signal (F2) is possible regardless of the ratio F2/F1, where F1 is the carrier frequency. A plurality of the modulating and demodulating circuits may also be combined with summing means to obtain any whole multiple, $n(F1)$, of a signal, F1, $n$ being an integer.

OBJECTS OF THE INVENTION

Accordingly, a primary object of the present invention is to provide an improved modulating and demodulating circuit for producing at least one double sideband suppressed carrier signal, including a pair of dual-channel amplitude modulators each operable to produce a pair of unsuppressed-carrier amplitude-modulated output signals; carrier signal phase inverter means for supplying a carrier signal to each channel of the amplitude modulators to cause full-wave operation of each amplitude modulator wherein the unsuppressed-carrier of one output of each amplitude modulator is in-phase with said carrier signal input, and the unsuppressed-carrier of the other output of each amplitude modulator is 180 degrees out-of-phase with said carrier signal input; modulating signal phase inverter means for supplying a modulating signal in opposite phases to said dual-channel amplitude modulating circuits, respectively, thereby causing the envelopes of the outputs of each of said amplitude modulating circuits, respectively, to be in phase opposition, and first summing means for combining the carrier-in-phase output signal of one amplitude modulator with the carrier-out-of-phase output signal of the other amplitude modulator to obtain a first double sideband output signal from which the carrier signal has been cancelled, and second summing means for combining the carrier out-of-phase output signal of one amplitude modulator with the carrier-in-phase output signal of the other amplitude modulator to obtain a second double sideband output signal from which the carrier signal has been cancelled and which is in phase opposition to the said first double sideband output signal, and double sideband pull-relax isolation amplifier means for amplifying said double sideband signals, respectively.

According to another feature of the invention, the modulating and carrier input signals may be caused to have the same frequency whereby the double sideband output signals have a frequency which is twice that of the carrier input signal and precise phase relationships with said carrier input signal.

A more specific object of the invention is to provide apparatus of the type described above, including third summing means for combining the carrier-in-phase output signal of the first amplitude modulator with the carrier-in-phase output signal of the other amplitude modulator to obtain a first reconstituted carrier signal which is in-phase with the carrier input signal and from which the sidebands have been cancelled, fourth summing means for combining the carrier-out-of-phase output signal of the first amplitude modulator with the carrier-out-of-phase output signal of the other amplitude modulator to obtain a second reconstituted carrier signal which is out-of-phase with the carrier input signal and from which the sidebands have been cancelled, reconstituted carrier pull-relax isolation amplifier means for amplifying said reconstituted carrier signals, respectively, and feedback means connected with said reconstituted carrier isolation amplifier means for feeding back to the carrier signal input a portion of said reconstituted carrier signals. The invention has utility as a frequency multiplier, a frequency synthesizer, and a self local oscillator.

According to another object of the invention, the modulating and demodulating circuit includes a power supply, means being provided for effecting a constant current drain on the power supply regardless of the presence of the carrier and modulating signals. To this end, each of the modulating signal phase inverter means and the carrier signal phase inverter means includes a pair of transistors, in the presence of corresponding modulating and carrier signals, having a total currrent drain which is equal to the d-c bias drain through the transistors in the absence of modulating and carrier signals, respectively. Similarly, the amplitude modulators include similar pairs of modulating transistors, phase inverter transistors, impedance matching isolation summation transistors, which in combination have a net signal current drain equal to the d-c bias, and impedance matching isolation output amplifiers, the transistors of each pair being connected 180° out of phase with each other. The double sideband isolation amplifier means and the reconstituted carrier isolation amplifier means each includes a similar pair of transistors 180° out of phase with each other.

According to another object of the invention, a plurality of the modulating and demodulating devices may be combined in a system to obtain from a suppressed-carrier double-sideband-modulated input signal solely the original modulating signal of that input signal, all undesirable signals being electrically cancelled.

A further object of the invention is to provide a system in which a plurality of the modulating and demodulating devices are combined to obtain from a modulating input signal which comprises either an upper-sideband-suppressed-carrier modulated signal, a double-sideband-suppressed-carrier modulated signal, a lower-sideband-suppressed-carrier modulated signal, or an unsuppressed-carrier amplitude-modulated signal solely the original modulating signal of that input signal, all undesirable signals being electrically cancelled.

A further object of the invention is to provide a system including a plurality of the modulating and demodulating devices for obtaining solely the original modulating signal from an unsuppressed-carrier-amplitude-modulated input signal having an envelope that is the original modulating signal, all undesirable signals being electrically cancelled.

In accordance with the present invention, the output signals are completely free of device-generated harmonics, the modulating signal, all velocity modulation distortion, and all other types of distortion (even that caused by interaction between the signals due to the unavoidable impedance inherent in the power supply), thereby to assure distortion-free output signals. The apparatus is operable to provide, in both modulation and demodulation operations, a carrier signal of the proper frequency for injection at the corresponding first inputs of the AM modulators without the use of a separate local oscillator. Due to the full-wave, in-and-out-of phase, "pull/relax" operation, all signals with respect to the power supply are electrically cancelled. Thus, a constant current is drawn from the power supply regardless of the presence of either signal. No interactions of any of the signals through the power supply exist. There exists in the operation of the present invention the characteristic 180° phase shift of the first signal at each half cycle of the second signal at several of the device output terminals.

According to a more specific embodiment of the invention, the circuit comprises two amplitude modulation (AM) modulators of the type which electrically cancel all undesirable signals such as the modulating signal and all device-generated harmonics of the carrier signal. The apparatus does not produce harmonics of the modulating signal, and requires no low- or high-pass filters and no tuned circuits, the operation being completely independent of frequency. In the present invention, separate phase splitters are used for each AM modulator to provide for independent adjustment of the first signal insertion to each AM modulator. If precision operation of the device is not required, one phase splitter would suffice to feed the proper signals to both of the AM modulators. One phase splitter would also suffice for precision if certain controls are added to maintain the independent adjustment of said first signal insertion. Use of precisely matched components also permits the use of only one phase splitter. Further, separate emitter follower circuits are employed for each channel of each AM modulator wherein the second signal is inserted, thereby to provide for independent adjustment of second signal insertion to each channel, while avoiding loading of the signal-source transistors. If precision operation of the device is not required, a single emitter follower circuit would suffice to feed the second signal to both channels of an AM modulator. With respect to insertion of the modulating signal and the inherent current drain on the power supply, the modulating signal is inserted in-phase to the first AM modulator, and 180° out-of-phase to the second AM modulator. This results in mutual cancellation of the insertion current drain and thus the current drain remains constant regardless of the presence of the second signal.

Where summing is required, in certain cases an emitter follower circuit is employed so as to avoid "loading" the signal-source transistors, and so as to cause the signal-wise current drain from the power supply to remain constant by balancing equally and oppositely the signal-wise current drain of the emitter follower circuit with the signal-wise current drain of the signal-source transistors.

In certain other cases, equal and opposite signals are applied to pairs of transistors respectively, both to amplify the signals and also to cause mutual cancellation of the signal-wise current drains of the transistors so that the current drain on the power supply remains constant regardless of the presence of a signal.

The basic present invention disclosed herein offers the advantages that it is insensitive to carrier and modulating frequencies, requires no heavy, bulky inductors or variable capacitors, requires no precision selection and matching of component values, requires no tuning for the carrier and modulating frequencies applied, induces no velocity-modulation-distortion on any of the signals (including the sidebands), induces no amplitude-modulation-distortion on any of the signals (including the sidebands), and can be easily designed as an integrated circuit. The circuit has utility in such applications as multiplexing, upper and lower sideband communications, upper and lower sideband radar/sonar, and in any system wherein it is required to handle a wide range of carrier and modulating frequencies without adjustment. The circuit readily accommodates any carrier frequency applied from extremely low frequencies (ELF) up through the limits of the circuit elements employed. The carrier can, if desired, consist of more than one frequency simultaneously. The circuit is particularly suited for use in situations in which physical dimensions and power supply drain are critical, and when a modulating frequency is required to approach and even exceed that of the carrier frequency. The circuit can be used for modulating and demodulating a previously velocity-modulated carrier signal. Since the circuit adds no velocity-modulation-distortion of its own, demodulation of the doubly modulated signal can provide, in addition to the demodulated signal, the previously velocity-modulated carrier, provided a portion of the velocity-modulated carrier is reinserted with the DSB modulated signal. This results from the complete suppression of the carrier in the DSB modulating process both in the absence and presence of a modulating signal. If this condition exists, the velocity-modulated carrier signal can also be recovered in the demodulation process for further detection of the velocity-modulation information in an appropriate detector. In both modulation and demodulation, the circuit can provide its own carrier frequency for reinsertion, thereby eliminating the requirement for a separate local oscillator. The circuit can also be used as a frequency synthesizer wherein whole multiples of a carrier, say F1, can be obtained when combinations of several of this device are used with appropriate summing circuits. Once the whole-multiples-of-the-carrier frequencies desired are determined and the required combinations are established, F1 can be any frequency desired while nF1 is produced without special tuning and adjustment, $n$ being an integer.

BRIEF DESCRIPTION OF THE DRAWINGS

Other objects and advantages of the invention will become apparent from a study of the following specification when viewed in the light of the accompanying drawing, in which:

FIG. 5 is a block diagram of a system including a plurality of the circuits of FIG. 1 for obtaining solely the original modulating signal of a suppressed-carrier double-sideband-modulated input signal;

FIG. 6 illustrates the waveforms of the system of FIG. 5;

DETAILED DESCRIPTION

Figure 1:
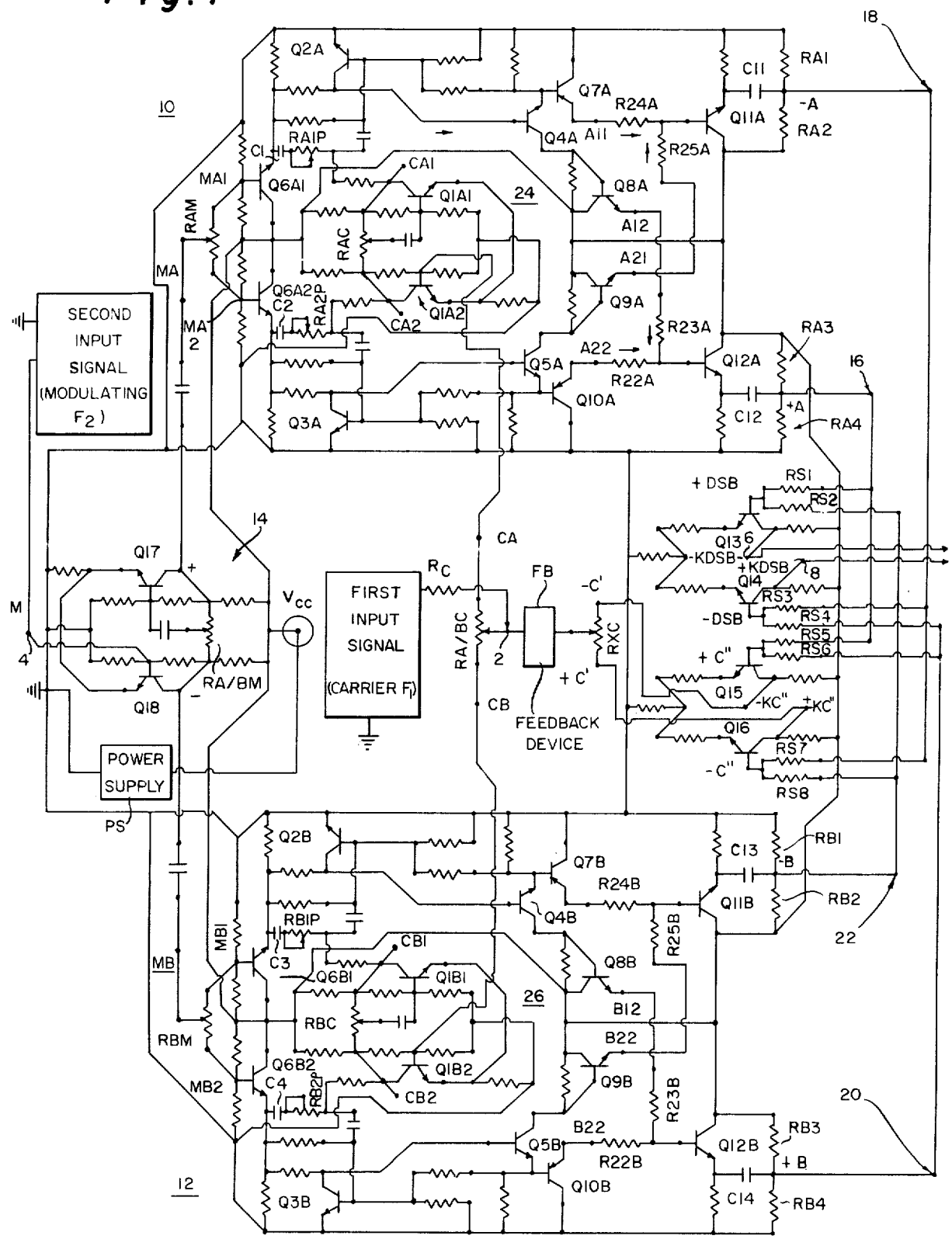
FIG. 1 is an electrical schematic diagram of the modulating and demodulating apparatus of the present invention.

Referring now to FIG. 1 a double-balanced modulator circuit is disclosed having a carrier signal input terminal 2 to which is applied a carrier signal F1, a modulating signal input terminal 4 to which is applied a modulating input signal F2, a pair of output terminals 6 and 8 at which double-sideband suppressed-carrier signals of opposite phase are produced, and a pair of dual-channel amplitude modulator circuits 10 and 12. The modulating signal F2 is applied in opposite phases to the amplitude modulators 10 and 12 via modulating signal phase-inverter splitter means 14 including transistors Q17 and Q18. The channels of the amplitude modulator circuits include emitter follower transistors Q6A1, Q6A2; Q6B1, Q6B2 for modulating signal input, control or modulating transistors Q2A, Q3A, Q2B, Q3B, signal phase inverter transistors Q4A, Q5A, Q4B, Q5B, and two pairs of impedance matching isolation summation transistors Q7A, Q9A; Q8A, Q10A; Q7B, Q9B; Q8B, Q10B. The carrier signal F1 is applied to the channels of the modulators in opposite phases via phase splitting means 24, 26 including transistors Q1A1, Q1A2; Q1B1, Q1B2, respectively. Connected with the outputs of the channels are emitter follower impedance matching devices Q11A, Q12A, Q11B and Q12B, respectively.

The output of emitter follower transistor Q11A is fed to the pair of summing resistors RS3 and RS7, and the outputs of emitter follower transistors Q12A, Q11B and Q12B are fed to pairs of summing resistors RS1, RS5; RS2, RS8; and RS4, RS6, respectively. Resistors RS1 and RS2 comprise first summing means for combining the carrier-in-phase output signal +A of the second channel 16 of the first amplitude modulator with the carrier-out-of-phase output signal −B of the first channel 22 of the other amplitude modulator to obtain a first double sideband output signal +DSB from which the carier signal has been cancelled, and resistors RS3, RS4 comprise second summing means for combining the carrier-out-of-phase output signal −A of the first channel 18 of the first amplitude modulator with the carrier-in-phase output signal +B of the second channel 20 of the second amplitude modulator to obtain a second double sideband output signal −DSB of opposite phase from said first double sideband output signal and from which the carrier signal has been cancelled. First double-sideband pull-relax isolation amplifier means including transistors Q13, Q14 amplify the first and second double sideband output signals without loading the first and second summing means. In the event that the modulating and carrier signals have the same frequency, the first and second double sideband output signals each have a frequency which is twice that of the carrier input signal and a precise phase relationship with said carrier input signal, whereby said amplitude modulating and demodulating circuit comprises a frequency doubling means.

The resistors RS5, RS6 comprise third summing means for combining the carrier-in-phase output signal +A of the second channel of the first amplitude modulator with the carrier-in-phase output signal +B of the second channel of the second amplitude modulator to obtain a first reconstituted carrier signal +C″ which is in-phase with the carrier input signal and from which the sidebands have been cancelled. Resistors RS7, RS8 comprise fourth summing means for combining the carrier-out-of-phase output signal −A of the first channel of the first amplitude modulator means with the carrier-out-of-phase output signal −B of the other amplitude modulator to obtain a second reconstituted carrier signal −C″ which is out-of-phase with the carrier input signal and from which the sidebands have been cancelled. Reconstituted carrier pull-relax isolation amplifier means including transistors Q15, Q16 amplify the reconstituted carrier signals, respectively, without loading the third and fourth summing means, which reconstituted carrier signals are combined by potentiometer RXC and are fed back to the carrier signal input terminal 2. The potentiometer RXC determines the strength and phase relationship of the reconstituted carrier with respect to the carrier input signal, thereby to establish and control Class AB operation of each amplitude modulator. In the event the feedback means includes a frequency selection means FB for feeding back to the carrier signal input only that frequency of the reconstituted carrier signal which equals the frequency of the carrier input signal, and RXC is properly set, the double balanced circuit operates as its own local oscillator.

The amplitude modulators 10 and 12 include potentiometer means RAC and RBC, respectively, for causing the amplitude modulator channel output signals A11, A12, A21, A22; B11, B12, B21 and R22 to have the same magnitude, respectively, in the absence of a modulating signal.

In order to control the magnitude of the carrier input signal supplied to the amplitude modulators, respectively, a potentiometer RA/BC is connected between the carrier signal input terminal 2 and the carrier signal phase inverter circuits of amplitude modulators 10 and 12, respectively, whereby the magnitude of the carrier-in-phase output signal +A of the first amplitude modulator equals that of the carrier-out-of-phase output signal −B of the other amplitude modulator, and the magnitude of the carrier-out-of-phase output signal −A of the first amplitude modulator equals that of the carrier-in-phase output signal +B of the other amplitude modulator in the absence of a modulating signal.

In order to control the magnitude of the modulating signal applied to the amplitude modulators 10 and 12, respectively, to cause the magnitude of the envelopes of the output signals +A, −A of the first amplitude modulator to equal the magnitudes of the output signals +B, −B of the second amplitude modulator, the modulating signal phase inverter 14 is provided with a potentiometer RA/BM. Furthermore, potentiometers RAM, RBM are associated with the first and second amplitude modulators, respectively, for causing the modulating signal to be applied equally to each channel thereof. Finally, adjustment means RA1P, RA2P and RB1P, RB2P are provided in the modulator channels for controlling the operation of the control devices Q2A, Q3A and Q2B, Q3B, respectively, so that the percent conduction time of the carrier in the associated control device, respectively, remains constant regardless of the instantaneous magnitude of the modulating signal.

In accordance with another important feature of the invention, means are provided for providing a constant current drain on the power supply regardless of the presence of the carrier and modulating signals. To this end, the modulating signal phase inverter means 14 includes a pair of transistors Q17, Q18 which are connected with the power supply to establish a given d-c bias drain through the transistors in the absence of a modulating signal, said transistors being connected in 180° phase opposition to each other, whereby in the presence of a modulating signal, the total current drain of both transistors is equal to said given d-c bias current drain. Furthermore, the carrier signal phase inverter means includes for each amplitude modulator a pair of transistors Q1A1, Q1A2 and Q1B1, Q1B2, respectively, said transistors being connected with the power supply to establish a given d-c bias drain through the transistors in the absence of the carrier signal, the transistors of each pair being connected for operation in 180° phase opposition to each other, whereby in the presence of said carrier signal, the total current drain of both transistors is equal to said given d-c bias current drain. Moreover, each of the amplitude modulators includes a pair of modulating transistors Q2A, Q3A and Q2B, Q3B, a pair of signal phase inverter transistors Q4A, Q5A and Q4B, Q5B, and two pairs of impedance matching isolation summation transistors Q7A, Q9A; Q8A, Q10A and Q7B, Q9B; Q8B, Q10B, said transistors being so connected with the power supply that a given d-c bias drain is established through the transistors in the absence of both of the carrier and modulating signals. The summation transistors are connected to operate in 180° phase opposition to the net operation of the modulating and signal phase inverter transistors, whereby in the presence of the carrier and modulating signals, the total current drain of all the transistors is equal to the given d-c bias current drain.

Similarly, the pairs of impedance matching isolation output amplifiers Q11A, Q12A and Q11B, Q12B associated with the amplitude modulators are connected to provide a constant current drain on the power supply regardless of the presence of the carrier and modulating signals, the transistors of each pair being connected for operation in 180° phase opposition to each other, whereby in the presence of said carrier and modulating signals, the total current drain of each transistor pair is equal to the d-c bias current drain. Also the double sideband isolation amplifier means includes a pair of transistors Q13, Q14 that are connected to provide a constant current drain on the power supply regardless of the presence of the carrier and modulating signals, said transistors being connected with the power supply to establish a given d-c bias drain through the transistors in the absence of the double sideband signals, said transistors being connected for operation in 180° phase opposition to each other, whereby in the presence of said double sideband signals, the total current drain of both transistors is equal to the given d-c bias current drain. The reconstituted carrier isolation transistors Q15, Q16 are connected with the power supply to establish a given d-c bias drain through the transistors in the absence of the reconstituted carrier signals, said transistors being connected for operation in 180° phase opposition to each other, whereby in the presence of the reconstituted carrier signals, the total current drain of both transistors is equal to the given d-c bias current drain.

Figure 2:
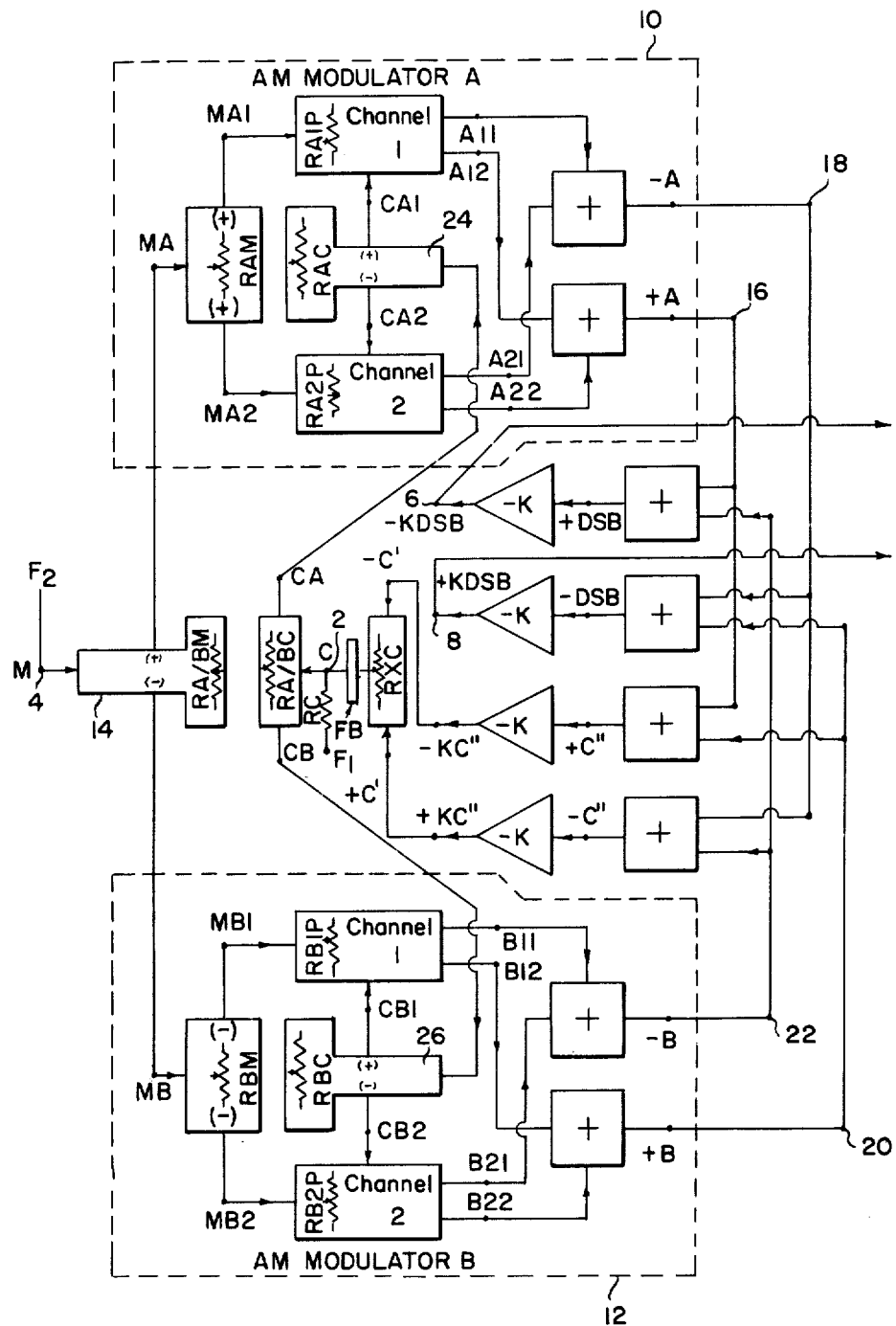
FIG. 2 is a block diagram of the circuit of FIG. 1.
Figure 3:
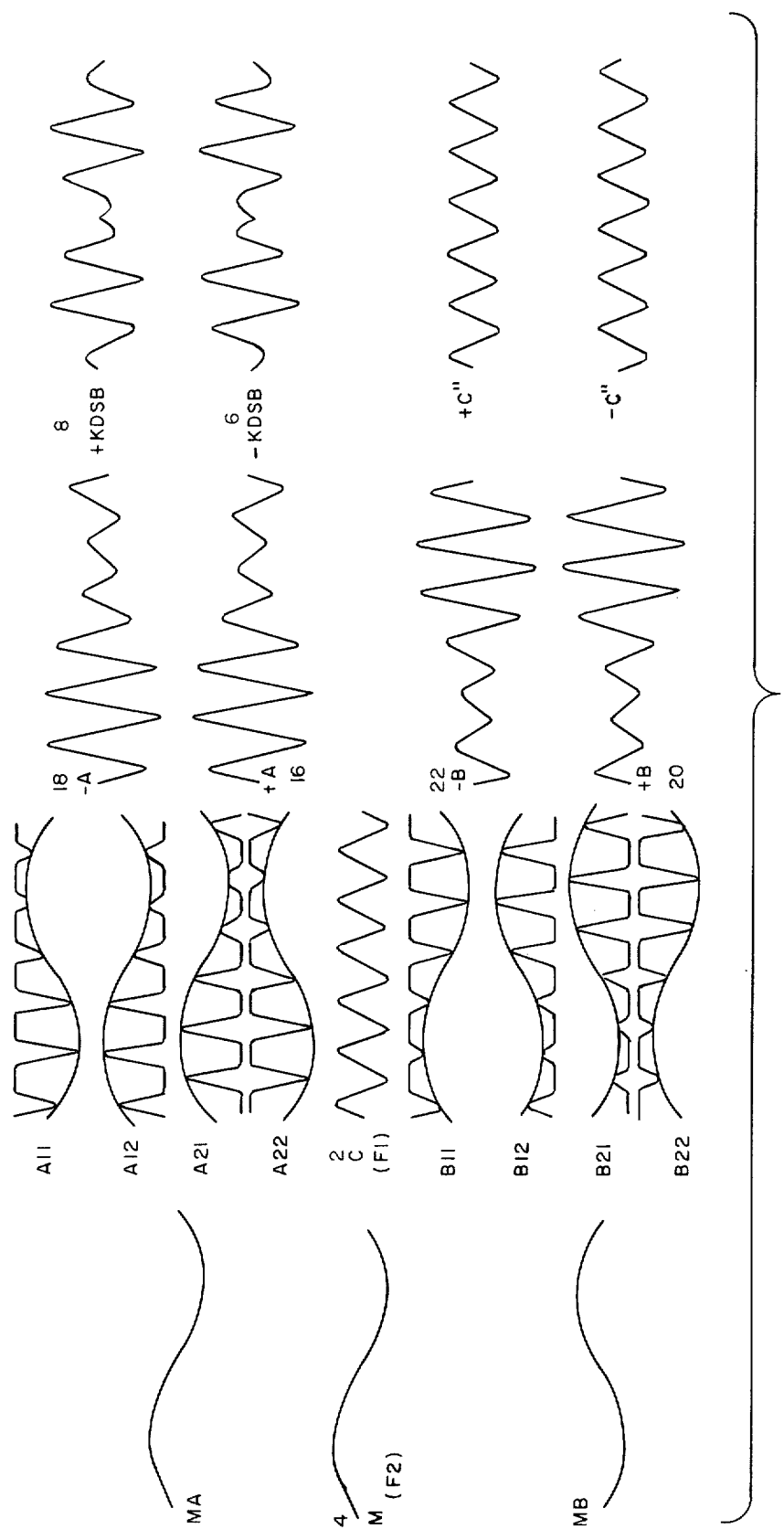
FIGS. 3 and 4 are waveforms of the apparatus of FIG. 1 operated in the modulating and demodulating modes, respectively.
Figure 4:
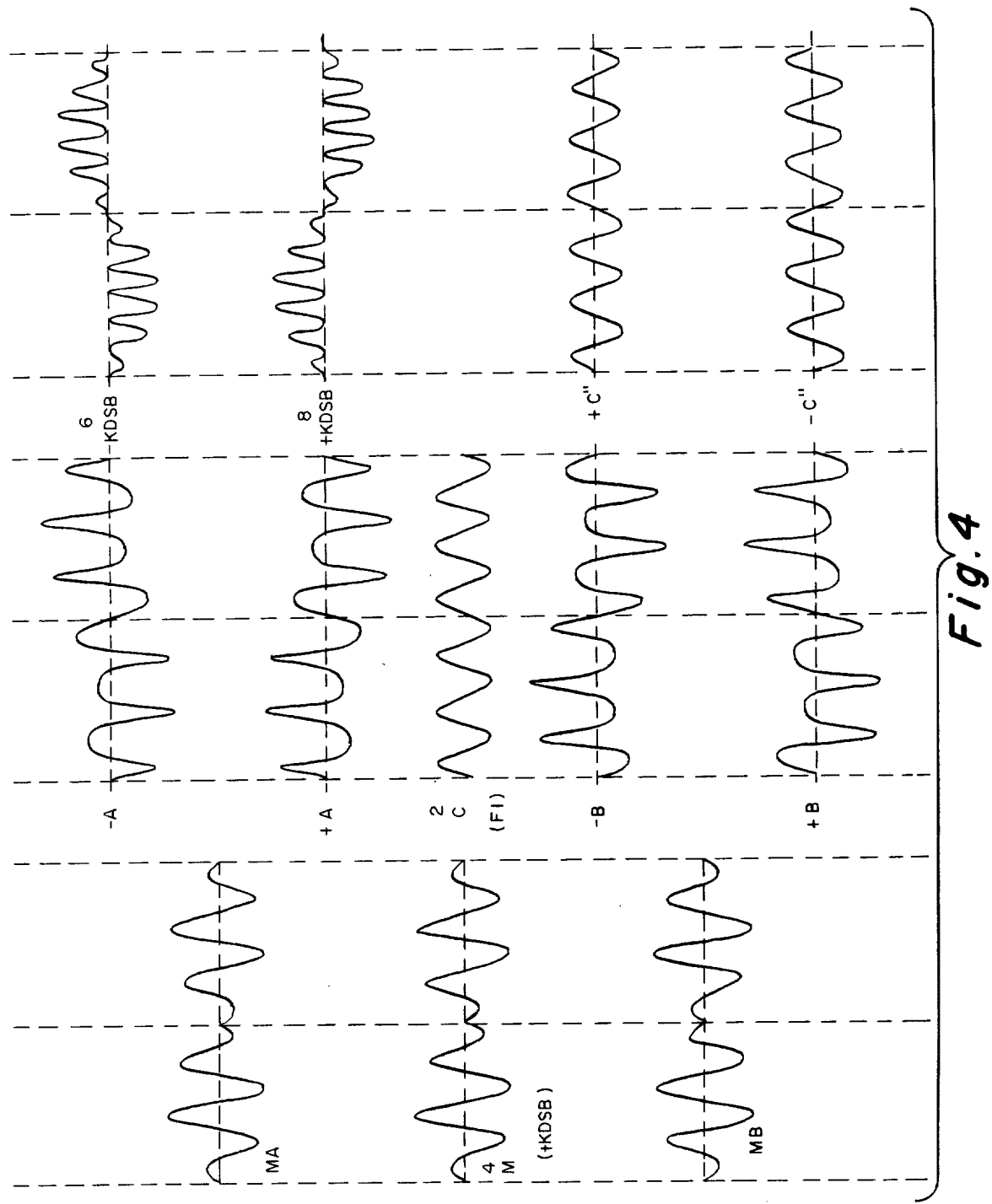

FIG. 2 illustrates a simplified block diagram of the detailed schematic circuit of FIG. 1, and FIG. 3 shows the modulation waveforms appearing at the corresponding terminals of FIG. 1. For demodulation operation of the circuit of FIG. 1, the waveforms have the configurations shown in FIG. 4.

Referring now to FIGS. 5 and 6, a plurality of the circuits of FIG. 1 may be combined to obtain the original modulating signal input F2 from a suppressed-carrier double-sideband-modulated input signal −KDSB1. Thus the first modulating and demodulating circuit 50 (corresponding to that of FIG. 1) produces both the original modulating signal F2 and a double sideband output signal (+DSB2) having a suppressed carrier frequency which is twice that of the suppressed carrier input signal and which is also modulated by the original modulating signal F2. Second and third modulating and demodulating devices 52 and 54 similarly correspond with the circuit of FIG. 1, the third device being connected to define a third signal source. More particularly, the local oscillator 56 supplies a signal having a frequency F1 to the carrier signal input terminals c of the first and third devices 50 and 54. The local oscillator signal is also applied to the modulating input terminal m of the third device via a variable resistance, whereby the output signal at terminal 8 having a frequency of twice the local oscillator frequency is connected with the carrier signal input c of the second device 52. The double-sideband suppressed carrier signal −DSB2 appearing at the output terminal 6 of the second device is summed with the output signal +DSB2, +F2 appearing at the output terminal 8 of the first device by summing means 58, the output of the summing means being supplied to the modulating signal input m of the second device 52 via magnitude control device 59. Consequently, the output signal F2 appearing at the output of the summing means is solely the original modulating signal. The waveforms of the system of FIG. 5 are shown in FIG. 6.

Figure 7:
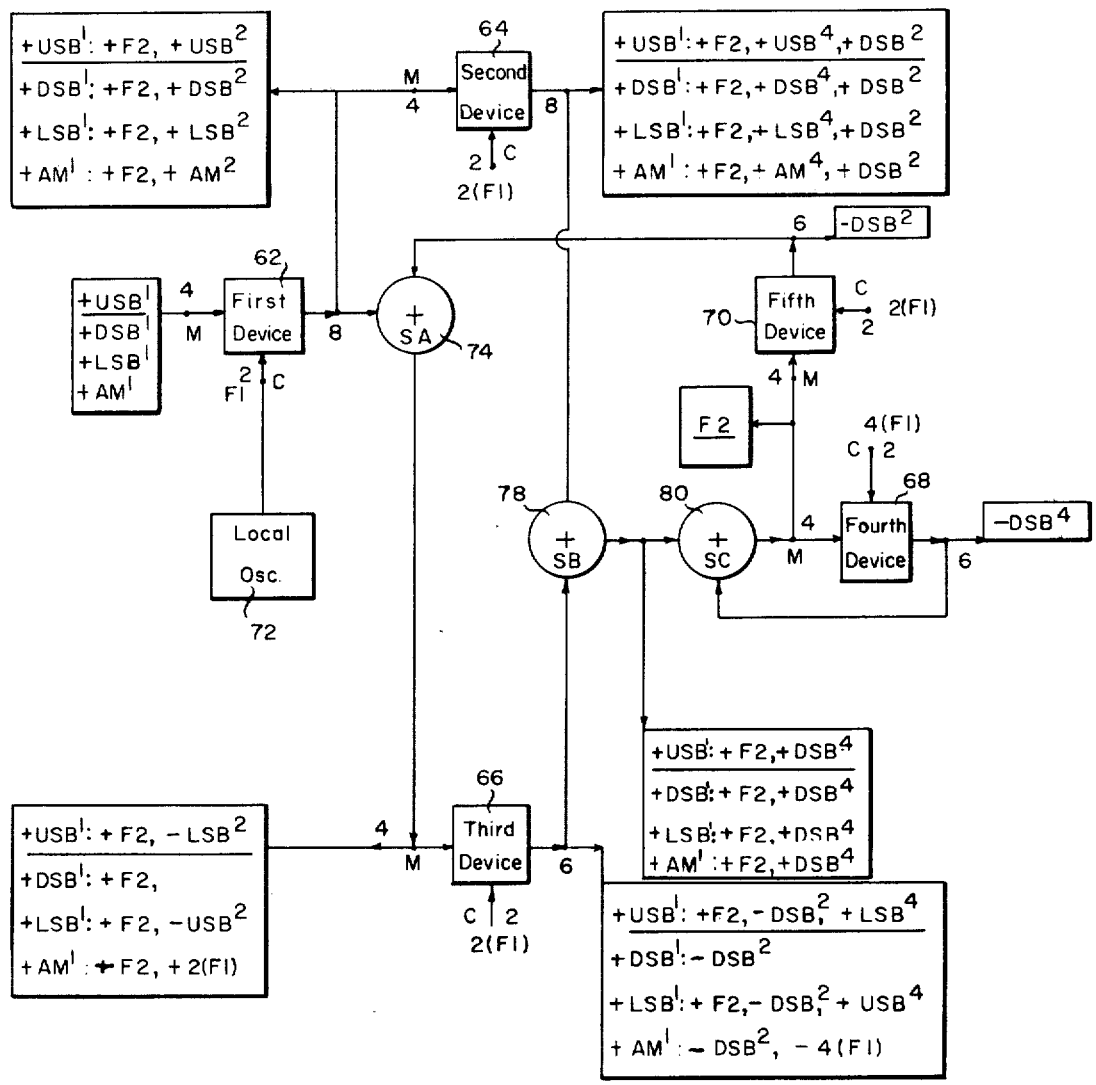
FIG. 7 is a block diagram including a plurality of the devices of FIG. 1 for obtaining solely the original modulating signal of an upper-sideband-suppressed-carrier-modulated input signal, a double-sideband-suppressed-carrier-modulated input signal, a lower-sideband-suppressed-carrier-modulated input signal, and of an unsuppressed-carrier amplitude-modulated input signal.

Referring now to FIG. 7, a system including a plurality of the modulating and demodulating devices is disclosed for obtaining solely the original modulating signal F2 from an upper-sideband-suppressed-carrier modulated signal USB, a double-sideband-suppressed carrier modulated signal DSB, and a lower-sideband-suppressed-carrier modulated signal LSB, and an unsuppressed-carrier amplitude-modulated signal AM. The input signal is applied to the modulating signal input m of a first amplitude modulating and demodulating device 62. Second, third, fourth and fifth devices 64, 66, 68 and 70 (each similar to the circuit of FIG. 1) are provided. A local oscillator 72 provides a signal F1 that is applied to the carrier signal input c of the first device, the output 8 of said first device being connected with the modulating signal input m of the second device and with one input terminal of the summing means 74, the output of which is connected with the modulating signal terminal of the third device 66. A signal 2(F1) having a frequency twice that of local oscillator 72 and of a precise phase relationship with said local oscillator frequency is applied to the carrier signal input terminals of the second, third and fifth devices 64, 66 and 70, respectively, and a signal having a frequency four times that of local oscillator 72 and of a precise phase relationship with said local oscillator frequency is applied to the carrier signal input of the fourth device 68. The output 8 from the second device 64 is connected with one input terminal of the summing means 78, and the other input terminal of the summing means 78 is connected with the output terminal 6 of the third device. The output terminal of the second summing means 78 is connected with one input terminal of the third summing means 80 having an output terminal which is connected with the modulating input terminals 4 of the fourth and fifth devices 68 and 70, respectively. The output terminal 6 of the fourth modulating device is connected with the second input terminal of the summing means 80. The ouput terminal 6 of the fifth device 70 is connected with the other input terminal of the summing means 74.

In operation, the single sideband signal is demodulated in the first device 62 and contains two frequencies, viz, the modulating signal F2, and the SB signal with a 'converted' "carrier" 2(F1). It is possible to obtain the complement of this signal (e.g., the lower sideband (LSB) if the input signal originally was an upper sideband (USB) signal) by adding the output of the first device in proper phase relationship to a DSB signal of the proper "carrier" frequency and of the proper magnitude. Such a signal is obtained from the fifth device 70 by inserting F2 of the proper magnitude, and 2(F1) to the fifth device. The complementary signal is now obtained at the output of summing means 74. These signals are now inserted into second and third devices 64 and 66, respectively, where they are used to obtain a DSB signal of specific phase with a "carrier" of 2(F1); a signal with a converted "carrier" of 4 (F1), the signal of the output of the third device being the complement of the second device, and F2, the modulating signal whose phase relationship from each device is additive. These two signals are now added in summing means 78 wherein the DSB signals containing the "carrier" 2(F1) are electrically cancelled, the complementary signals of a "carrier" of 4(F1) are combined to form a DSB signal with a 4(F1) "carrier" frequency, and the modulating signals F2 are present. What has been accomplished is the creation of a DSB signal in the correct relationship with F2. This signal is now operated on similarly as previously done in the system of FIG. 5. The introduction of a "carrier" frequency of 4(F1) to the fourth device and also the modulating signal F2 to the fourth device provides a DSB signal of the correct frequency, phase relationship, and magnitude so as to cancel the DSB portion of the output signal from summing means 78. This cancellation takes place in summing means 80. Thus, the output of summing means 80 contains only the original modulating signal F2. Since the additions and cancellations are all linear operations, the system will produce a pure F2 regardless of the input signal; i.e., this system is a universal system which will operate equally well on USB, DSB, LSB, and AM. Also, regardless of the input signal, certain other signals are produced as noted above. This systen can therefore be used also as a "carrier" frequency converter as well as a sideband inverter. Since controls were shown in FIG. 5 to provide a one-time-only precise system adjustment, similar controls are obviously applicable to the universal system of FIG. 7. Also, for clarity of explanation, two separate summing means were used, viz, summing means 78 and 80. Obviously these two summing means could be combined. There are many variations possible wherein it is possible to obtain only F2. Variation from the systems shown in FIG. 5 and FIG. 7 does not constitute departure from the basic concepts of the present invention as disclosed herein.

The two systems disclosed here and shown in FIG. 5 and FIG. 7 now permit recovery of a modulating signal whose frequency is equal to, and even greater than, that of the "carrier" signal.

Figure 8:
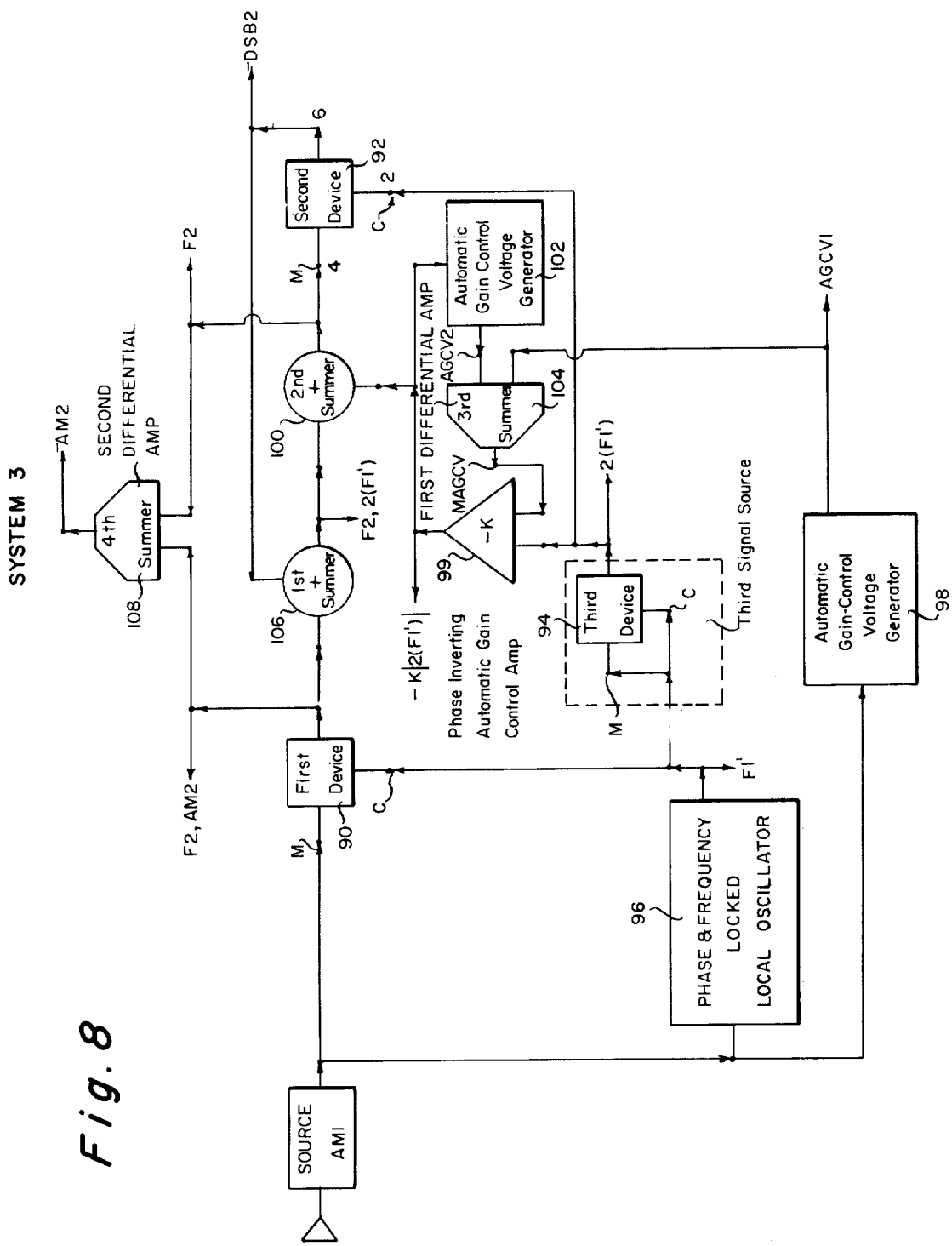
FIG. 8 is a block diagram of a system including a plurality of the devices of FIG. 1 for obtaining solely the original modulating signal of an unsuppressed-carrier-amplitude-modulated input signal.

Referring now to FIG. 8, a system is disclosed for recovering the original modulating signal F2 from an unsuppressed-carrier-amplitude-modulated signal AM1 having an envelope that is the original modulating signal. Use is made of first, second and third devices 90, 92 and 94 that correspond to the circuits of FIG. 1. The modulated input signal is applied to the modulating signal input terminal $m$ of the first device 90, to the phase and frequency locked local oscillator 96, and to the automatic gain-control voltage generator 98. The local oscillator signal F1 is applied to the carrier input terminal $c$ of the first device 90, and to the carrier and modulating terminals of the third device 94. Thus, the output of the third device has a frequency 2(F1) and is applied to the carrier input of the second device 92 and to one input of the phase-inverting automatic gain control amplifier 99. The output of amplifier 99 is fed to a second summing means 100 and to the input of a second automatic gain control generator 102. The outputs of the automatic gain control generators 98 and 102 are supplied to the input terminals of the differential amplifier 104 which defines third summing means. The output of the third summing means 104 comprises the other input of the phase-inverting automatic gain control amplifier 99.

The outputs of the first and second devices 90 and 92 are supplied to the inputs of the first summing means 106, and output of said summing means being supplied to the other input of the second summing means 100. The output terminal of the second summing means is connected both with the modulation input of the second device 92 and with one input of second differential amplifier 108 which defines fourth summing means. The output terminal of the first device 90 is also connected to the other input terminal of the fourth summing means 108.

In operation, the amplitude modulated signal AM1 is applied to local oscillator 96 in such a manner as to phase and frequency lock the local oscillator to the unsuppressed carrier portion of the said AM1 signal so as to obtain a local carrier signal, F1', of the proper phase and frequency for use elsewhere in the system, and to obtain a first automatic gain control voltage (AGCV1) which is proportional to the strength of the said AM1 signal, for use elsewhere in the said system. The said AM1 signal is also applied to the modulation input of said first double-balanced, suppressed-carrier, double-sideband modulator 90. The said local carrier signal, F1', is applied to the carrier input of said first device 90. The output signal from said first device consists of only two signals; viz, the modulating signal F2, and an amplitude modulated signal, AM2, whose unsuppressed carrier frequency is twice that of the original unsuppressed carrier frequency, F1. The signal strength of the AM2 signal is in direct proportion to the signal strength of said AM1 input signal; the envelope of said AM2 output signal, and the magnitude of said recovered modulating signal (F2) being in direct proportion to the envelope of said AM1 input signal. The said local carrier, F1', is also applied both to the modulating and the carrier inputs of the third device 94. The output of the third device is a signal whose frequency is twice that of said F1'; i.e., 2(F1'), and whose phase relationship to said local carrier, F1', is precisely maintained. This said 2(F1') signal is applied to the carrier input of a second device 92. The said recovered modulating signal, F2, is applied to the modulating input of said second device. The output signal of said second device is a double-sideband signal, −DSB2 whose suppressed carrier frequency is 2(F1'), and whose phase relationship is precisely determined and maintained. The magnitude of said −DSB2 signal is in direct proportion to the magnitude of said recovered F2 signal which is in direct proportion to the envelope of said input signal, AM1. Said DSB2 signal is added linearly to the output signal of said first device is a first summation circuit 106 where it cancels the envelope of the said AM2 portion of said output signal of said first device, thereby obtaining the modulating signal, F2, and the unsuppressed carrier portion of the said AM2 signal. The output signal, 2(F1'), of said third device is also applied to an automatic gain control amplifier whose output signal, −k[2(F1')] (i.e., −k times the magnitude of the signal whose frequency is 2(F1')) is used to generate a second automatic gain control voltage, AGCV2. Said AGCV2 is compared with said AGCV1 in a first differential amplifier 104. The output of said first differential amplifier is a master automatic gain control voltage, MAGCV, which is applied to said AGC amplifier, thereby affecting the gain K of said AGC amplifier. The output signal, −k[2(F1')] is now summed with the said output signal, (F2, 2(F1')), of said first summation circuit 106 in the second summation circuit 100 whose output consists solely of said recovered modulating signal F2. Additionally, the output signal of said first device and the output signal of said second summation circuit are applied to a second differential amplifier whose output signal consists solely of an unsuppressed-carrier, amplitude-modulated signal whose carrier frequency is twice that of said AM1 input signal, and whose envelope characteristics correspond directly to the envelope of said AM1 input signal. Controls for proper magnitude cancellations are obvious and so are not shown. The system therefore performs the following operations:

a. The modulating signal is recovered from an unsuppressed-carrier, amplitude-modulated signal, without filters, with no frequency sensitive attenuation and phase shifting, completely free of all undesirable signals; therefore its frequency may equal and even exceed that of the carrier signal.

b. An unsuppressed-carrier, amplitude-modulated signal is converted to another unsuppressed-carrier, amplitude-modulated signal whose unsuppressed carrier frequency is twice that of the original signal and whose envelope is the same as that of the original signal.

c. An unsuppressed-carrier, amplitude modulated signal is converted to a suppressed-carrier, double-sideband signal wherein the suppressed-carrier frequency is twice that of the unsuppressed-carrier of the original signal.

d. A local carrier signal is obtained whose frequency and phase precisely correspond to the carrier of a previously amplitude modulated signal. Thus, if the original carrier had also been velocity modulated with additional information, this additional information is now recoverable by the use of appropriate detection devices.

Figure 9:
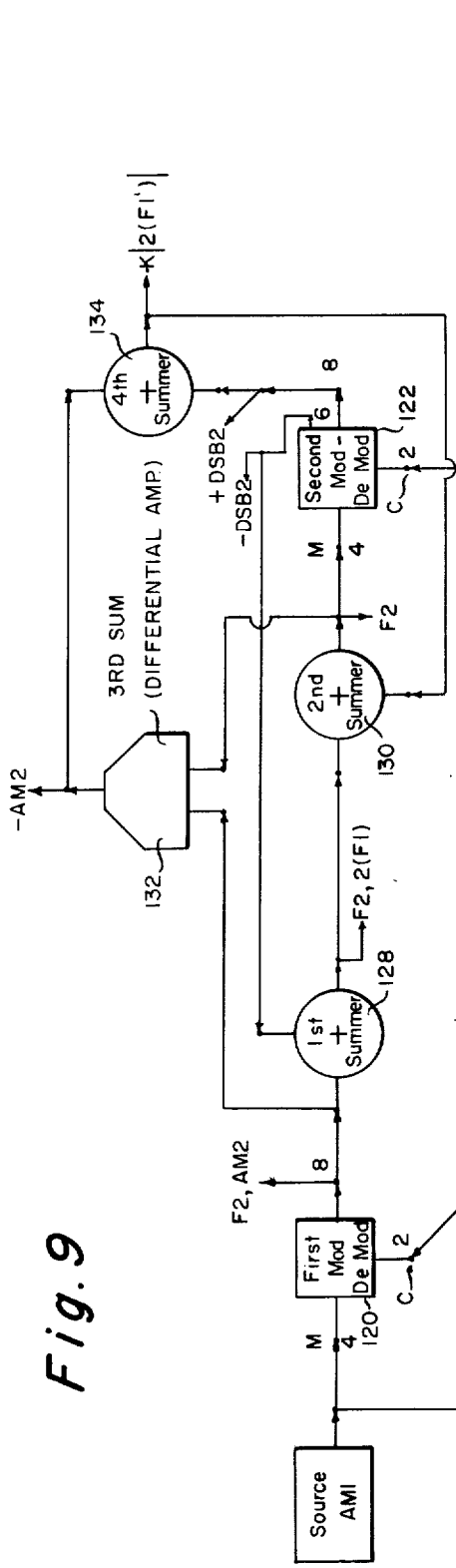
FIG. 9 is a block diagram of a modification of the apparatus of FIG. 8.

FIG. 9 illustrates an alternative to the embodiment of FIG. 8, use being made of first, second and third modulating and demodulating devices 120, 122 and 124. The modulating signal AM1 is applied to the modulating input of the first device 120 and to the phase and frequency locked local oscillator 126. The local oscillator signal F1' is applied to the carrier input c of the first device 120 and to the modulator and carrier inputs of the third device 124, whereby the third device operates as a frequency doubler for transmitting a signal 2(E1') to the carrier input of the second device 122. The output terminals of the first 8 and second 6 devices are connected with the inputs of first summing means 128, and the output of the first summing means is connected with one input of the second summing means 130, the output of which is connected with the modulating input of the second device 122. The output of the second summing means 130 is also connected with one input of third summing means 132 and the output of the first modulating and demodulating device 120 is also connected with the other input of the third summing means 132, the output terminal of which and the other output terminal 8 of the second device are connected with fourth summing means 134. The output of the fourth summing 134 is connected with the other input terminal of the second summing means 130, whereby only the desired original modulating signal F2 appears at the output of the second summing means.

Figure 10:
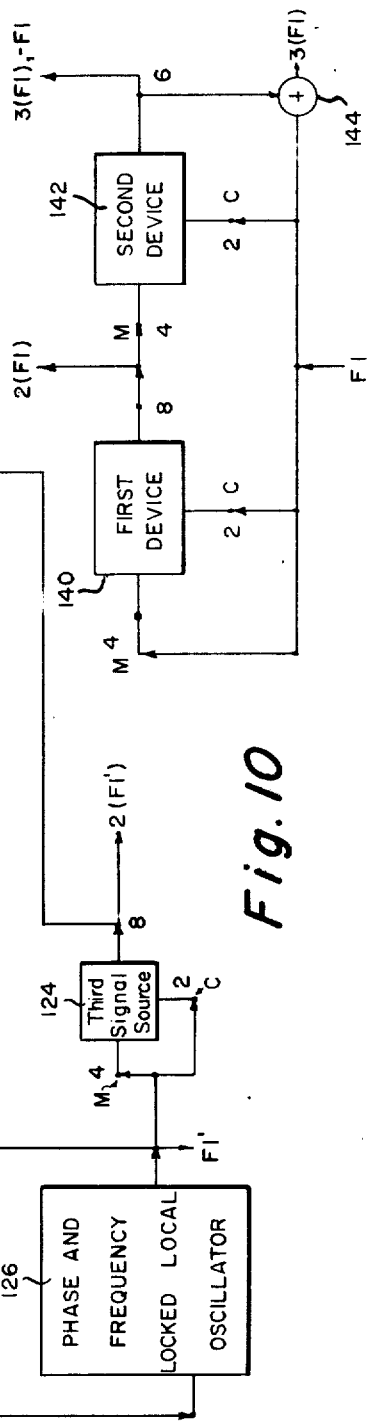
FIG. 10 is a block diagram of a system which provides output frequencies of 2(F1) and 3(F1) when F1 is the fundamental frequency.

In the embodiment of FIG. 10, a frequency multiplying circuit is disclosed for providing multiples of the input signal F1. More particularly, the input signal is applied to the modulating signal input terminal and the carrier input terminal of a first modulating and demodulating device 140, to the carrier signal input terminal of a second modulating and demodulating device 142, and to one input terminal of summing device 144. The output terminal of the first device is connected with the modulating signal input of the second device, and the output terminal of the second device is connected with the second input terminal of the summing device 144. A signal 2(F1) which is twice the frequency of input signal F1 appears at the output terminal of the first device, and signals 3(F1) which are three times that of the input frequency and −F1 appear at the output terminals of the second device 142, and a sole signal 3(F1) appears at the output terminal of summing means 144. It is obvious that by providing additional modulating and demodulating devices and additional summing means, further multiples of the input frequency may be obtained as desired.

Other modifications and embodiments may be produced without deviating from the inventive concepts set forth above.

What is claimed is:

1. A first double-balanced modulatingg and demodulating circuit for producing from carrier and modulating input signal sources at least one double sideband suppressed carrier signal, comprising a. a pair of dual-channel amplitude modulators each operable to produce a pair of unsuppressed-carrier amplitude-modulated output signals (+A, −A; +B, −B), the unsuppressed carrier of one output of each pair of signals (+A, +B) of each amplitude modulator being inphase with said carrier signal and the unsuppressed carrier of the other output of each pair of signals (−A, −B) of each amplitude modulator being 180° out-of-phase with said carrier signal;

b. carrier signal phase inverter means (24, 26) for connecting said carrier signal source with each channel of said amplitude modulators to cause one channel of each amplitude modulator to operate on the positive portion of each cycle of said carrier signal and the other channel of each amplitude modulator to operate on the negative portion of each cycle of said carrier signal, thereby permitting full-wave operation of each amplitude modulator;

c. modulating signal phase inverter means (14) for supplying said modulating signal in opposite phases to said amplitude modulating circuits, respectively, thereby causing the envelopes of the outputs (+A, −A; +B, −B) of each of said amplitude modulating circuits, respectively, to be in phase opposition; and d. first summing means (RS1, RS2) for combining the carrier-in-phase output signal (+A) of a first amplitude modulator with the carrier out-of-phase output signal (−B) of the other amplitude modulator to obtain a first double sideband output signal (+DSB) from which the carrier signal has been cancelled.

2. Apparatus as defined in claim 1, and further comprising e. second summing means (RS3, RS4) for combining the carrier-out-of-phase output signal (−A) of the first amplitude modulator with the carrier-in-phase output signal (+B) of the second amplitude modulator to obtain a second double sideband output signal (−DSB) of opposite phase from said first double sideband output signal and from which the carrier signal has been cancelled; and
f. double-sideband pull-relax isolation amplifier means (Q13, Q14) for amplifying said first and second double sideband output signals, respectively, without loading said first and second summing means.

3. Apparatus as defined in claim 2, wherein said modulating signal has the same frequency as said carrier input signal, whereby said first and second double sideband output signals each have frequencies which are equal to the sum and to the difference of said modulating and carrier input signals, thereby producing signals having precise phase relationships with the carrier signal, and frequencies equal to twice the carrier signal and to zero.

4. Apparatus as defined in claim 2, and further including
g. third summing means (RS5, RS6) for combining the carrier-in-phase output signal (+A) of the first amplitude modulator with the carrier-in-phase output signal (+B) of the other amplitude modulator to obtain a first reconstituted carrier signal (+C″) which is in-phase with the carrier input signal and from which the sidebands have been cancelled;
h. fourth summing means (RS 7, RS8) for combining the carrier-out-of-phase output signal (−A) of the first amplitude modulator with the carrier-out-of-phase output signal (−B) of the other amplitude modulator to obtain a second reconstituted carrier signal (−C″) which is out-of-phase with the carrier input signal and from which the sidebands have been cancelled;
i. reconstituted carrier pull-relax isolation amplifier means (Q15, Q16) for amplifying said reconstituted carrier signals, respectively, without loading said third and fourth summing means; and
j. feedback means (RXC; FB) connected with said isolation amplifier means for feeding back to the carrier signal input a portion of said reconstituted carrier signals.

5. Apparatus as defined in claim 4,
wherein said feedback means further includes potentiometer means (RXC) for determining the strength and phase relationship of the reconstituted carrier with respect to the carrier input signal, thereby to control the Class AB operation of each amplitude modulator.

6. Apparatus as defined in claim 5, wherein said feedback means further includes frequency selection means (FB) for feeding back to the carrier signal input only that frequency of the reconstituted carrier signal which equals the frequency of the carrier input signal, whereby the double balanced circuit operates as its own local oscillator.

7. Apparatus as defined in claim 1, and further including means associated with each amplitude modulator (RAC, RBC) for causing the channel output signals of said amplitude modulator (A11, A12, A21, A22; B11, B12, B21, B22) to have the same magnitude, respectively, in the absence of a modulating signal.

8. Apparatus as defined in claim 1, and further including means (RA/BC) for controlling the magnitude of the carrier input signal applied to said amplitude modulators, respectively, to cause the magnitude of the carrier-in-phase output signal (+A) of the first amplitude modulator to equal that of the carrier-out-of-phase output signal (−B) of the other amplitude modulator, and the magnitude of the carrier-out-of-phase output signal (−A) of the first amplitude modulator to equal that of the carrier-in-phase output signal (+B) of the other amplitude modulator in the absence of a modulating signal.

9. Apparatus as defined in claim 1, and further including means (RA/BM) for controlling the magnitude of the modulating signal applied to the amplitude modulators, respectively, to cause the magnitude of the envelopes of the output signals (+A, −A) of the first amplitude modulator to equal the magnitude of the envelopes of the output signals (+B, −B) of the second amplitude modulator.

10. Apparatus as defined in claim 1, and further including means (RAM, RBM) associated with each amplitude modulator for supplying the modulating signal equally to each channel thereof.

11. Apparatus as defined in claim 1, wherein each channel of each amplitude modulator contains a control device (Q2A, Q3A; Q2B, Q3B); and further including adjustment means (RA1P, RA2P; RB1P, RB2P) associated with the channels of each modulator for causing the percent conduction time of the carrier in the associated control device to remain constant regardless of the instantaneous magnitude of the modulating signal.

12. Apparatus as defined in claim 4, and further including
a power supply (PS); and
means providing a constant current drain on the power supply regardless of the presence of the carrier and modulating signals.

13. Apparatus as defined in claim 12, wherein said modulating signal phase inverter means includes a pair of transistors (Q17, Q18), said constant current drain means including means connecting said power supply with said transistors to establish a given d-c bias drain through the transistors in the absence of a modulating signal, and means connecting said transistors for operation in 180° phase opposition to each other, whereby in the presence of a modulating signal, the total current drain of both transistors is equal to said given d-c bias current drain.

14. Apparatus as defined in claim 12, wherein said carrier signal phase inverter means includes for each amplitude modulator a pair of transistors (Q1A1, Q1A2; Q1B1, Q1B2), said constant current drain means including means connecting said power supply with said transistors to establish a given d-c bias drain through the transistors in the absence of said carrier signal, and means connecting said transistors for operation in 180° phase opposition to each other, whereby in the presence of said carrier signal, the total current drain of both transistors is equal to said given d-c bias current drain.

15. Apparatus as defined in claim 12, wherein each of said amplitude modulators includes a pair of modulating transistors (Q2A, Q3A; Q2B, Q3B), a pair of signal phase inverter transistors (Q4A, Q5A; Q4B, Q5B), and two pairs of impedance matching isolation summation transistors (Q7A, Q9A; Q8A, Q10A, Q7B, Q9B, Q8B, Q10B), said constant current drain means including means connecting said power supply with said transistors to establish a given d-c bias drain through the transistors in the absence of both said carrier and modulating signals, and means connecting the summation transistors to operate in 180° phase opposition to the net operation of the modulating and signal phase inverter transistors, whereby in the presence of said carrier and modulating signals, the total current drain of all said transistors is equal to said given d-c bias current drain.

16. Apparatus as defined in claim 12, wherein each of the amplitude modulators includes a pair of impedance matching isolation output amplifiers (Q11A, Q12A; Q11B, Q12B), said constant current drain means including means connecting said power supply with said transistors to establish a given d-c bias drain through the transistors in the absence of both said carrier and modulating signals, and means connecting said transistors for operation in 180° phase opposition to each other, whereby in the presence of said carrier and modulating signals, the total current drain of both transistors is equal to said given d-c bias current drain.

17. Apparatus as defined in claim 12, wherein said double sideband isolation amplifier means includes a pair of transistors (Q13, Q14); and means providing a constant current drain on said power supply regardless of the presence of the carrier and modulating signals, said constant current drain means comprising means (RS1, RA3, RA4; RS2, RB1, RB2; RS3, RA1, RA2; RS4, RB3, RB4) connecting said power supply with said transistors to establish a given d-c bias drain through the transistors in the absence of said double sideband signals; and means (RS1, C12, RS2, C13; RS3, C11, RS4, C14) connecting said transistors for operation in 180° phase opposition to each other, whereby in the presence of said double sideband signals, the total current drain of both transistors is equal to said given d-c bias current drain.

18. Apparatus as defined in claim 12, wherein said reconstituted carrier isolation amplifier means includes a pair of transistors (Q15, Q16); and means providing a constant current drain on the power supply regardless of the presence of the carrier and modulating signals, said constant current drain means comprising means (RS5, RA3, RA4; RS6, RB3, RB4; RS7, RA1, RA2; RS8, RB1, RB2) connecting said power supply with said reconstituted carrier isolation amplifier transistors to establish a given d-c bias drain through the transistors in the absence of said reconstituted carrier signals, and means (RS5, C12, RS6, C14; RS7, C11, RS8, C13) connecting said transistors for operation in 180° phase opposition to each other, whereby in the presence of said reconstituted carrier signals, the total current drain of both transistors is equal to said given d-c bias current drain.

19. Apparatus as defined in claim 2, wherein said carrier signal source comprises a local oscillator (56); and wherein said modulating signal source comprises a suppressedcarrier double-sideband-modulated input signal (+ KDSB1) which has been modulated by an original modulating signal (F2) and having a suppressed carrier whose frequency is F1, whereby the output signal of said first modulating and demodulating circuit comprises said original modulating signal (F2) of said input signal and a double sideband output signal (+DSB2) having a suppressed carrier frequency which is twice that of the suppressed carrier frequency of said input signal and which also is modulated by said original modulating signal (F2);

and means for obtaining said original modulating signal (F2), comprising another double-balanced modulating and demodulating circuit (52);

a third source of a signal having a frequency twice that of the carrier signal and in precise phase relationship relative thereto;

summation means (58) having a first input terminal connected with the output terminal of the first modulating and demodulating circuit (50), said summation means including also a second input terminal connected with the output terminal of said other modulating and demodulating circuit (52), and an output terminal; means connecting the third signal source with the carrier signal input terminal of said other modulating and demodulating circuit (52); and means including a signal magnitude control device (59) for connecting the modulating signal input terminal of said other modulating and demodulating circuit (52) with the output terminal of said summation means (58), whereby the output signal of said other modulating and demodulating circuit comprises a double sideband suppressed carrier signal having a frequency which is the same as, and phase of which is 180° out-of-phase from, the double sideband portion of the signal appearing at the output terminal of said first modulating and demodulating circuit, so that only the original modulating signal appears at the output terminal of said summation means, regardless of the ratio of F2/F1.

20. Apparatus as defined in claim 2, wherein said carrier signal source comprises a local oscillator (72); and wherein said modulating signal source comprises one of the modulated signals of an upper-sideband-suppressed-carrier modulated signal, a double-sideband-suppressed-carrier modulated signal and a lower-sideband-suppressed-carrier modulated signal; each of said modulated signals having been modulated by an original modulating signal (F2), and each having a suppressed carrier whose frequency is F1; and wherein said modulating source is an amplitude modulated signal (AM1) having been modulated by an original modulating signal (F2) having an unsuppressed carrier (F1); whereby the output of said first modulating and demodulating circuit (62) comprises said original modulating signal (F2) of said input signal, and another signal the suppressed or unsuppressed carrier of which has a frequency which is twice that of the suppressed or unsuppressed carrier of said input signal and the magnitudes of the sidebands of which agree with the magnitudes of the sidebands of the input signal, said other signal also being modulated by said original modulating signal (F2);

and means for obtaining said original modulating signal (F2), comprising second (64), third (66), fourth (68) and fifth (70) doublebalanced modulating and demodulating circuits;

a third source of a signal (2(F1)) having a frequency twice that of, and having a precise phase relationship relative to, said carrier signal;

a fourth source of a signal (4(F1)) having a frequency four times that of, and having a precise phase relationship relative to, said carrier signal;

first summing means (74) having an output terminal connected with the modulating signal input terminal of the third modulating and demodulating circuit (66), and a pair of input terminals connected with the output terminals of said first and fifth modulating and demodulating circuits, respectively;

means connecting the third source (2(F1)) with the carrier signal input terminals of the second (64), third (66) and fifth (70) modulating and demodulating circuits, respectively;

means connecting the fourth source (4(F1)) with the carrier signal input of the fourth modulating and demodulating circuit;

means connecting the modulating signal input terminal of said second circuit (64) with the output terminal of said first circuit (62);

second summing means (78) having an output terminal, and a pair of input terminals connected with the output terminals of said second (64) and third (66) modulating and demodulating circuits, respectively; and third summing means (80) having an output terminal connected with the modulating signal input terminals of said fourth and fifth circuits, and a pair of input terminals connected with the output terminals of said second summing means and said fourth circuit, respectively, whereby only said original modulating signal (F2) appears at the output terminal of said third summing means, regardless of the ratio F2/F1.

21. Apparatus as defined in claim 2, wherein said modulating signal source comprises an unsuppressed-carrier-amplitude-modulated signal (AM1) having an envelope that is the original modulating signal (F2) and a carrier frequency of F1;

and means for obtaining said original modulating signal (F2), comprising a second modulating and demodulating circuit (92);
phase-and-frequency-locked local oscillator means (96) including input and output terminals;
first (98) and second (102) automatic gain-control voltage generators;
first (106), second (100) and third (104) summing devices each having a pair of input terminals and an output terminal;
phase-inverting automatic gain control amplifier means (99);
a third signal source of a signal having a frequency twice that of the signal of the local oscillator means and in precise phase relationship relative thereto;
means connecting said modulating input signal with the input terminals of said local oscillator means (96) and said first automatic-gain control voltage generator (98), said voltage generator being operable to produce a direct-current output voltage (AGCV1) in direct proportion to the signal strength of said modulating input signal, the output signal of said local oscillator means having a precise frequency and phase relative to the unsuppressed carrier of said modulating input signal;
means connecting the output terminal of the local oscillator means (96) with the carrier input terminal of said first modulating and demodulating circuit;
means connecting the output terminals of said first (AGCV1) and second AGCV2) automatic gain control voltage generators with the input terminals of said third summing device, respectively;
means connecting the output terminals of said third signal source and said third summing device (MAGCV) with the input terminals of said phase-inverting automatic gain control amplifier means (99), respectively;
means connecting the output terminal of said phase-inverting automatic gain control amplifier (99) with one input terminal of the second summing device (100) and with the input terminal of the second automatic gain control voltage generator (102);
means connecting said third signal source with the carrier signal input terminal of said second modulating and demodulating circuit (92);
means connecting the output terminals of said first (90) and second (92) modulating and demodulating circuits with the input terminals, respectively, of said first summing device (106);
means connecting the output terminal of said first summing device with the other input terminal of said second summing device (100); and
means connecting the output terminal of said second summing means (100) with the modulating signal input terminal of said second modulating and demodulating circuit (92), whereby the output signal of said second summing means consists solely of the said original modulating signal (F2).

22. Apparatus as defined in claim 21, and further including a fourth summation device (108) including a pair of input terminals and an output terminal; and means connecting the output terminals of said first modulating and demodulating circuit (90) and said second summing means (100) with the input terminals of said fourth summing means (108), respectively, whereby the output signal appearing at the output terminal of said fourth summing means consists of an amplitude modulated signal (−AM2) having an unsuppressed carrier frequency that is twice that of the unsuppressed carrier of said modulating signal source (AM1), an envelope which is the same as that of the said modulating signal source, a signal strength which is in direct proportion to that of the modulating input signal, and a percent modulation equal to that of the modulating signal input.

23. Apparatus as defined in claim 2 wherein said modulating signal source comprises an unsuppressed-carrier-amplitude modulated signal (AM1) having an envelope that is the original modulating signal (F2) and a carrier frequency F1; and further including means for obtaining solely said original modulating signal (F2), including a second modulating and demodulating circuit (122); phase-and-frequency-locked local oscillator means (126) having at least one signal output terminal;
first (128), second (130), third (132), and fourth (134) summation devices each having at least a pair of signal input terminals and at least one signal output terminal; a third signal source (124) of a signal (2(F1')) having a frequency twice that of said local oscillator means and in precise phase relationship relative thereto;
means connecting said modulating input signal (AM1) with the input terminal of said local oscillator means (126), the output signal of said local oscillator means having a precise frequency and phase relative to the unsuppressed carrier of said modulating input signal;
means connecting the output terminal of said local oscillator means (126) with the carrier input terminal of said first modulating and demodulating circuit (120);

means connecting said third signal source (124) with the carrier signal input terminal of said second modulating and demodulating circuit;

means connecting one output terminal of each of said first and second modulating and demodulating circuits with the input terminals respectively, of said first summation device (128);

means connecting the output terminal of said second summation device (130) with the modulating signal input terminal of said second modulating and demodulating circuit (122), and with one input terminal of said third summation device (132);

means connecting the output terminal of said first modulating and demodulating device (120) with the other input terminal of said third summing device;

means connecting the output terminal of said first summation device (128) with one input terminal of said second summation device (130);

means connecting the output terminal of said third summation device (132) and the other output terminal of said second modulating and demodulating circuit (122) to the input terminals of said fourth summation device; and means connecting the output terminal of said fourth summation device (134) with the other input terminal of said second summation device (130), whereby the output signal of said second summation device consists solely of said original modulating signal (F2), all undesirable signals having been electrically cancelled, regardless of the ratio F2/F1.

* * * * *